United States Patent [19]

Boss et al.

[11] Patent Number: 4,880,684
[45] Date of Patent: Nov. 14, 1989

[54] SEALING AND STRESS RELIEF LAYERS AND USE THEREOF

[75] Inventors: David W. Boss, Beacon; Timothy W. Carr, Hopewell Junction; Derry J. Dubetsky, Wappingers Falls; George M. Greenstein, Hopewell Junction; Warren D. Grobman, Carmel; Carl P. Hayunga, Poughkeepsie; Amanda H. Kumar, Hopewell Junction, all of N.Y.; Walter F. Lange, Longmont, Colo.; Robert H. Massey; Paul H. Palmateer, both of Wappingers Falls, N.Y.; John A. Romano, Hopewell Junction, N.Y.; Da-Yuan Shih, Poughkeepsie, N.Y.

[73] Assignee: International Business Machines Corporation, Armonk, N.Y.

[21] Appl. No.: 167,290

[22] Filed: Mar. 11, 1988

[51] Int. Cl.[4] .......................... B32B 3/00; B32B 7/00; B44C 1/22; B29C 37/00
[52] U.S. Cl. ..................................... 428/209; 29/846; 29/851; 29/852; 156/89; 156/630; 156/643; 156/644; 219/121.69; 264/61; 361/403; 427/96; 428/210; 428/446; 428/458; 428/601; 428/901
[58] Field of Search ................. 156/89, 629, 630, 633, 156/643, 644, 655, 659.1, 901, 902; 219/121.68, 121.69, 121.85; 29/846, 851, 852; 174/68.5; 427/96-98; 428/209, 210, 446, 458, 601, 901; 264/58, 60, 61, 62, 63; 361/397, 400, 403, 409, 412

[56] References Cited

U.S. PATENT DOCUMENTS

| | | | |
|---|---|---|---|
| 3,683,105 | 8/1972 | Shamash et al. | 174/68.5 |
| 4,067,099 | 1/1978 | Ito et al. | 29/571 |
| 4,237,606 | 12/1980 | Niwa et al. | 29/830 |
| 4,386,116 | 5/1983 | Nair et al. | 427/99 |
| 4,430,365 | 2/1984 | Schaible et al. | 427/96 |
| 4,569,876 | 2/1986 | Nakakita | 428/131 |
| 4,624,896 | 11/1986 | Watanabe et al. | 428/428 |
| 4,799,983 | 1/1989 | Desai | 156/89 |
| 4,805,683 | 2/1989 | Magdo et al. | 156/643 |

FOREIGN PATENT DOCUMENTS 8303943  4/1983  PCT Int'l Appl.

OTHER PUBLICATIONS

IBM Technical Disclosure Bulletin, vol. 24, No. 10, Mar. 1982, pp. 5111–5112, "Interlevel Connections for MLC" by Desai et al.

IBM Technical Disclosure Bulletin, vol. 15, No. 6, Nov. 1972, p. 1974, "Multilayer Ceramic Module Leak Rates" by L. V. Gregor et al.

Primary Examiner—William A. Powell
Attorney, Agent, or Firm—Anne V. Dougherty; Ira D. Blecker

[57] ABSTRACT

Sealing and stress relief are provided to a low-fracture strength glass-ceramic substrate. Hermeticity is addressed through the use of capture pads in alignment with vias and through polymeric overlays with interconnection between the underlying via or pad metallurgy and the device, chip, wire or pin bonded to the surface of the layer. Multilevel structures are taught along with a self-aligned sealing and wiring process.

60 Claims, 2 Drawing Sheets

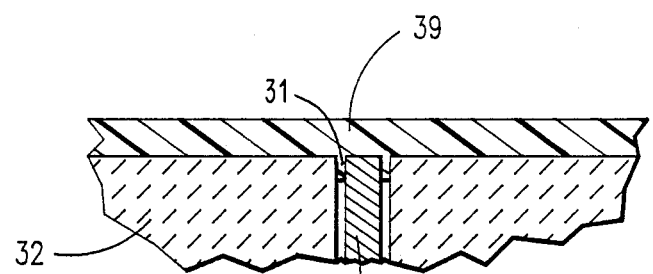
FIG. 3A
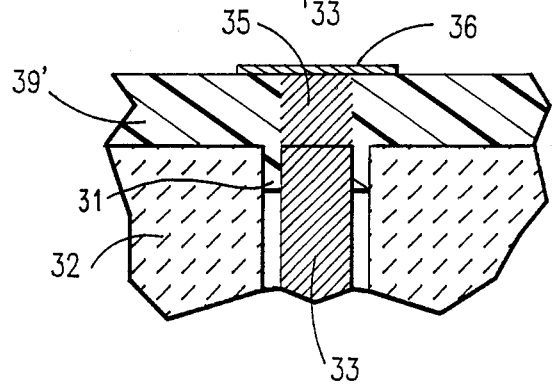
FIG. 3B
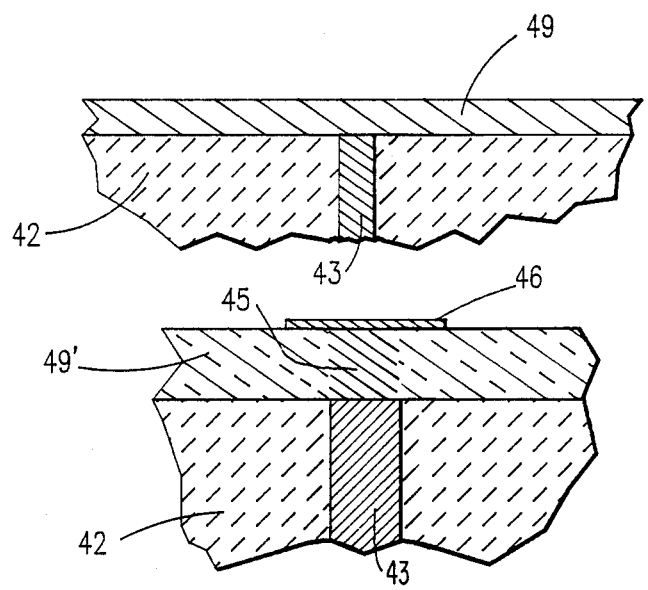
FIG. 4A
FIG. 4B
FIG. 4C

SEALING AND STRESS RELIEF LAYERS AND USE THEREOF

SUMMARY OF THE INVENTION

This invention relates to hermetic substrates for microelectronic applications. More particularly, it relates to the use of sealing layers to seal substrates and to provide a low stress base for the mounting of devices on the substrates.

BACKGROUND OF THE INVENTION

In the microelectronic environment, there is a need for high density, high strength packaging to provide interconnection between semiconductor devices and connection from the devices to the electrical power supply. The electrical properties which are desirable include a highly conductive medium in a highly insulative carrier medium having a low dielectric constant. Thermally, the package must withstand not only the operating environment but also the thermal excursions encountered during the processing and fabrication of the part. Mechanically, it is preferable to have a substrate package which can withstand chip and pin joining stresses and stresses related to interconnecting with the next level of packaging. Furthermore, the package should be hermetic to prevent degradation of any of the desired properties due to leakage. Alumina has offered many of the mechanical properties needed, but does not have the optimum electrical and thermal characteristics. From an electrical standpoint, alumina has a relatively high dielectric constant. The thermal coefficient of expansion for alumina is not compatible with that of the silicon material used in chips. The thermal expansion incompatibility results in fatigue failures in the alumina-to-silicon interconnections. An additional drawback to the use of alumina is the fact that alumina has a very high sintering temperature (in the range of 1100°–1600° C.) which limits the choices for a co-sinterable metallurgy to high melting point refractory metals such as molybdenum or tungsten. The electrical properties of the high temperature metallurgies are less desirable; most notably, they have relatively high resistivity values.

Glass-ceramic composites have been explored as the dielectric materials to replace alumina. The compositions, having a low dielectric value and a favorable coefficient of thermal expansion, appear to be good alternatives to alumina. An added benefit to the use of composites is the lower temperature at which the materials sinter. Sintering temperatures in the range of 850°–1000° C. permit the use of cosinterable metallurgies such as gold, silver and copper, all of which have superior conductivity over the previously employed refractory metals. The disadvantage of using glass-ceramic compositions is that they generally have low strength and toughness as compared with the prior art dielectric materials. Low fracture strength results in cracking due to thermal expansion mismatch between the dielectric materials and the associated metallurgy. Should cracking occur during processing, the package may become permeable to processing solutions which could compromise the integrity of the package. A method has been taught in an accompanying pending application Ser. No. 167,606 filed concurrently with the subject application on Mar. 11, 1988, the teachings of which are hereby incorporated by reference, wherein a uniform gap is created between the ceramic and the associated internal metallurgy in order to provide an expansion zone between the thermally mismatched materials. Necessarily, the creation of such a gap results in exposure of the substrate to processing solvents which may directly affect the materials and less directly affect the performance of the part. The invention taught and claimed herein provides a solution to the hermeticity problem while simultaneously providing stress dissipation to prevent ceramic fracture.

Prior solutions to the stated problems include the use of dielectric materials to fill voids or cracks such as is taught in IBM Technical Disclosure Bulletin Volume 16, Number 2, page 624 (July 1973) and in U.S. Pat. No. 4,237,606. Filling voids and cracks with a glass layer, such as is taught in each of the references, can eliminate the porosity, provided the size of the pores and the surface tension of the material are not incompatible so as to prevent a complete fill. The problem of incomplete fill, mentioned above, is not an insignificant consideration. Filling the micropores encountered in ceramics and glass-ceramics processing requires materials which can fill spaces of submicron dimensions, which many of the non-reactive, inorganic dielectric materials cannot achieve. A further concern with the use of certain inorganic layers/fillers is that the fill material will not provide any relief from the stresses associated with the package and its use. Organic layers have been proposed as protective layers over completed modules wherein the devices have been mounted on the substrate and all interconnection is complete. In one example, IBM Technical Disclosure Bulletin Vol. 15, No. 6, page 1974 (November 1972), an article describes the use of an organic material layer to seal the assembly from the subsequently introduced cooling fluids. A similar use of an organic material deposited over a substrate assembly can be seen in IBM Technical Disclosure Bulletin Vol. 29, No. 3, page 1073 (August 1986) wherein a polymeric layer is used as a barrier to emission of alpha particles from the substrate. In each instance, the use of the organics is restricted to final processing, by which time many harmful fluids may already have been trapped in the assembly. Furthermore, planarity is not a concern in a finished assembly, as it is prior to device joining It is therefore an objective of the subject invention to provide a method and structure for obtaining an hermetic substrate and for providing a planar low stress base for making interconnection to said substrate.

The subject invention not only deals with the sealing and stress difficulties but does so in situ at the substrate level thereby providing a superior, planar base for mounting devices.

BRIEF DESCRIPTION OF THE DRAWINGS

A first embodiment of the present invention teaches a structure including a capture pad deposited on the top and bottom surfaces of the fired substrate in alignment with the internal metal features of the substrate. A stress relief layer is deposited over the capture pads and over the entire surface of the substrate. Interconnection is made from the capture pad on the substrate surface to the outer surface of the stress relief layer whereupon is deposited a bonding pad on which to connect pins, devices, wires, etc.

A second embodiment similarly deposits a stress relief/sealing layer on the sintered substrate surface. The second embodiment, however, does not require the use of a capture pad and interconnection structure associated with the internal metal feature. Rather, the stress relief/sealing layer is selectively treated to exhibit conductivity in the regions in alignment with and abutting the internal metal features while the remaining regions of the layer act as a conformal dielectric sealing layer. In each embodiment, connection is then made at or about the surface of the sealing/stress relief layer.

Still another embodiment provides a co-sintered metal stud for interconnection at the top surface of the sealing/stress layer and the method of implementing same.

Figure 1:
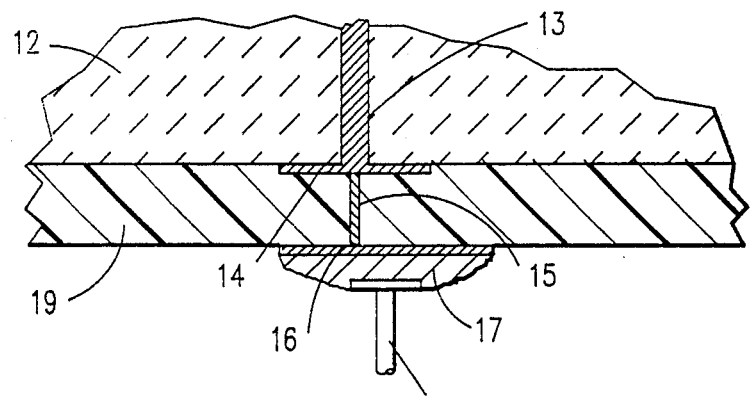

The invention will be described in greater detail with specific reference to the drawings wherein:

FIG. 1 is a cross-sectional view of the first embodiment of the inventive structure as applied to the bottom surface of a substrate.

Figure 2:
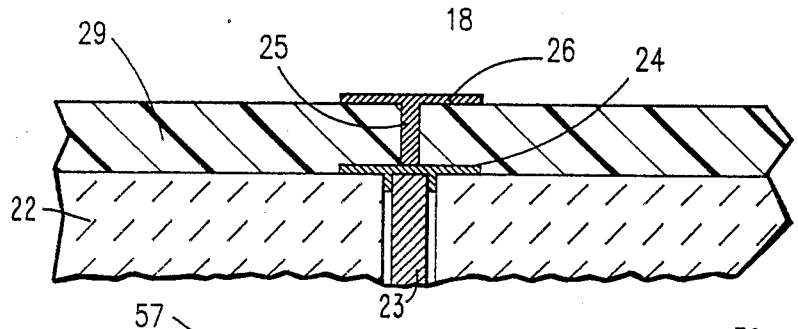

FIG. 2 is a cross-sectional view of the first embodiment of the invention applied to the top surface of the substrate.

FIGS. 3A and 3B illustrate a cross-sectional view of the method and structure of the second embodiment of the invention wherein conductivity is induced in selected regions of a non-conductive sealing layer.

FIGS. 4A, 4B and 4C illustrate, in cross-sectional view, the method and structure of the second embodiment of the invention wherein the regions of a conductive sealing layer which are not in alignment with the internal features of the substrate are treated to become insulative/non-conductive.

Figure 5:
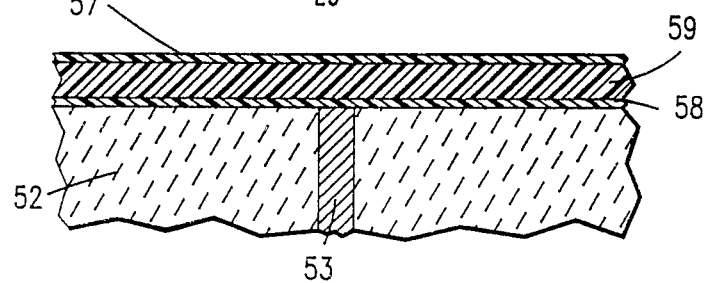

FIG. 5 illustrates a layered polymer structure exhibiting both good adhesion and superior stress absorption.

Figure 6:
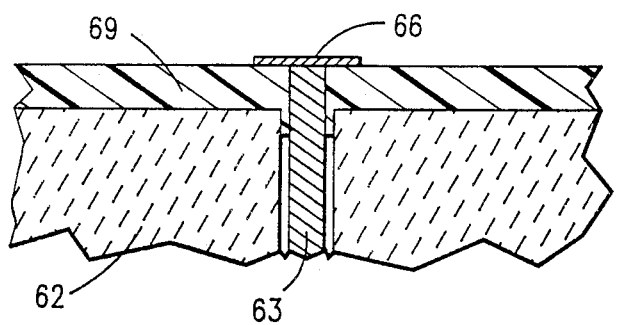

FIG. 6 illustrates the inventive structure wherein the interconnection between the substrate and the top surface of the sealing/stress layer is made through a co-sintered connection.

Figure 7:
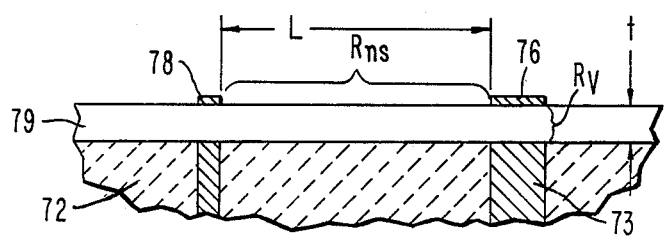

FIG. 7 illustrates, in cross-sectional view, the use of a selected conformal sealing film wherein the film is conductive is certain geometric arrangements and non-conductive in others.

DETAILED DESCRIPTION OF THE DRAWINGS

As discussed above, the selection of dielectric materials for packaging in semiconductor applications involves mechanical and thermal prerequisites along with the preferred electrical properties. The ideal electrical properties of glass-ceramic composites, of the type taught and claimed in U.S. Pat. No. 4,301,324 of Kumar, et al (the teachings of which are herein incorporated by reference), along with their thermal compatibility for use with silicon-based devices, and co-sinterability with low melting point, superior conductivity metallurgies, make the glass-ceramic composites most desirable. Again, the mechanical strength of the materials is somewhat lower than is required to withstand the standard multilayer ceramic processing.

Standard multilayer ceramic processing has been taught in several patent documents. An example is the teaching found in U.S. Pat. No. 3,518,756 wherein the basic steps are: mixing a slurry of ceramic particles and binders; casting the slurry into sheets; drying the sheets; forming a pattern of holes in the sheets by punching or other methods; metallizing the sheets by screening into the holes or by another deposition technique; stacking the metallized sheets; laminating the stack; and, firing the stack to burn off the binders and to sinter the ceramic and metallurgy. Processing after the formation of the basic package includes top surface metallization and device joining along with bottom surface pin joining. The steps in these processes which impart the greatest stresses to the glass-ceramic materials include firing at high temperatures and post-sintering thermal processes.

The thermal stresses associated with firing arise from the mismatch in coefficients of thermal expansion of the materials, specifically the mismatch between the glass-ceramic expansion and that of the metallurgy. A metallurgy based upon copper or gold will expand, under high heating conditions, such as the 700°-1000° C. discussed in Kumar, et al, at a rate which is roughly quadruple the expansion of the ceramic material. For the relatively brief period that the materials are subjected to extremely high temperatures, the ceramic material is placed under great stresses which can result in cracking of the ceramic. As discussed above, the cracking of the ceramic material will permit processing solvents to permeate the substrate. Trapped solvents in the vicinity of the metallurgy will lead to corrosion; whereas fluids trapped in the bulk of the dielectric material can lead not only to material break-down but also to further stresses and bloating of the substrate during the subsequent temperature excursions. Ultimately, the performance of the entire package is compromised by the presence of any porosity in the substrate. Rather than alter the materials and, unavoidably, change those electrical properties for which one has specifically chosen the glass-ceramic composition and the metallurgy, it is preferable to minimize the effects and thereby remedy the hermeticity problem. Thermal expansion mismatch stresses can be minimized by adjusting the TCE (thermal co-efficient of expansion) of the associated materials; however, this approach will alter the electrical properties of the final package. The present invention seeks not necessarily to eliminate the cracking but to eliminate the permeability associated with cracks. With regard to the post-sintering stresses, the thermal processing steps will occasion the same TCE problems. In addition, there are mechanical stresses imparted by the bonding arrangements which can cause the underlying ceramic to fracture. As with the thermal properties, the mechanical strength of the substrate material cannot readily be changed without impacting the dielectric constant of the insulative material. However, the mechanical stresses on the substrate can be minimized by the subject invention.

The first embodiment of the invention is a structure comprising a glass-ceramic substrate comprising a crystallizable glass such as a cordierite-based system processed through sintering in accordance with known techniques such as taught in U.S. Pat. No. 3,518,756 and having a blanket stress relief and sealing layer deposited over the entire horizontal surfaces of the package. The sealing layer is preferably deposited over the sintered substrate and its co-sintered surface metallurgy. The sealing layer is most advantageously a polymeric material. A temperature stable polyimide, such as a BTDA-APB, is ideal with Thermid (a Trademarked product of the National Starch Company) being the best mode known to date. Temperature stability of the polyimide or other sealing material is critical not only for operation, but also to provide a thermally stable underlayer for deposition of bonding pads and joining of pins or devices, all of which will involve temperature excursions in excess of operating temperatures. The choice for the overlying layer is preferably a polymeric material given the superior mechanical properties of a polymer. When bonding pads or other features are deposited onto the polymeric layer, any mechanical stresses are readily dissipated in the flexible polymer medium; thereby, alleviating the stress on the low-fracture strength glass-ceramic. The polymeric layer must be chosen to be impervious to whatever processing solvents are needed for completion of the package. Furthermore, polymeric coatings are favorable in that they are readily deposited in a planar fashion. Deposition of the polymeric layer can be achieved by spin coating or any number of well-known deposition techniques. Furthermore, it is not critical to the subject invention whether the polymer is deposited "neat" (i.e. without solvents), or deposited in a solvent solution with the subsequent driving-off of solvents. Neither is it envisioned that the method of curing or polymerizing the polymer would be significant to the invention, provided that the underlying substrate will not be exposed to any processing solvents or byproducts which could permeate into the body of the metallized substrate.

A multilayer polymeric overcoat is illustrated in FIG. 5 wherein layers, 57 and 58, of materials having superior adhesive qualities surround a layer, 59, of material having superior mechanical ability with regard to stress dissipation. In a sample structure, a thin (1–4 microns) layer, 58, of a PMDA-ODA derived polyimide, was first deposited as a polymeric sealing layer exhibiting high adhesion to glass-ceramic and the metallurgy. A thicker (6–15 micron), intermediate layer, 59, of a polymer having superior "cushioning" effects such as the BTDA-APB derived polyimide is deposited over the thinner layer, 58. Finally, another thin (1–4 micron) layer, 57, of, for example, the PMDA-ODA derived polyimide is deposited over the intermediate layer to provide a good adhesive base for deposition of a bonding pad. With respect to the superior adhesive qualities, adhesion to both the ceramic and the metal features is a factor for the first-deposited layer, 58. Good adhesion to metal is the criterion for the uppermost layer, 57.

Electrical connection from the surface of the preferably polymeric overlayer to the underlying metal features at the substrate surface can be achieved in a variety of manners. The first embodiment, above and illustrated in FIGS. 1 and 2 for the bottom and top surfaces respectively, provides for the overlayer to be deposited over the substrate surface inclusive of co-sintered metallurgical features, 14 in FIG. 1 and 24 in FIG. 2. The metal features illustrated therein are deposited as "capture pads" to provide not only a bonding pad for subsequent joining but also a seal about the via itself. Surface capture pads can have a diameter which is substantially greater than the diameter of the underlying internal feature; thereby providing a large target for subsequent interconnection. As illustrated in FIGS. 1 and 2, and disclosed in the concurrently filed patent application referenced above, the package can be fabricated with a uniform gap about the via after sintering. That gap may be filled as taught in the referenced application, or can be sealed off with the sealing layer or with a metal capture/bonding pad as illustrated herein. The capture pad may be deposited in a known metallization step either prior to the sintering of the part, or after the firing has been completed. The use of such a bonding pad would necessarily create stresses on both the via and the surrounding ceramic if the bonding of a pin or device were to be done directly to the pad at the substrate's surface. Therefore, the sealing layer is deposited over the substrate surface, inclusive of the metallurgical features. The sealing layer then provides the stress relief necessary to allow joining of pins or devices without undue stresses on the package.

Connection may be made through the overlayer by etching a via in the overlayer. Laser etching is a preferred method of directly etching a polymeric layer. Masking is not imperative if ablation by laser writing is used. Another method of providing a via in the overlayer is to use a photosensitive polymer for the overlayer, mask the regions of the overlayer not in alignment with the underlying metal, selectively expose the portion of the overlayer which is in alignment with the underlying capture pad and, with appropriate solvents, dissolve away that exposed portion of the overlayer. Those skilled in the art of photosensitive polymers will recognize that polymers can be chosen to operate as discussed above as negative resists, or other polymers can be chosen to operate as positive resists wherein the irradiated portion of the overlayer will remain intact and the masked regions in alignment with the vias will be dissolved away. Other methods of creating the opening for electrical connection to the underlying metal will be readily ascertainable by those having skill in the art. The capture pad provides sealing as well as a polymer-ablation target which minimizes alignment concerns; however, the polymer layer itself will seal off any via gaps in the absence of the capture pad. Ideally, direct alignment of interconnection metallurgy to via metallurgy can be achieved using the masks utilized for screening the top surface via metallurgy. The electrical connector, i.e. the interconnection metal as illustrated as 15 in FIG. 1 and 25 in FIG. 2, between the underlying metal and the surface of the overlayer may be a metal or metal-based paste which is screened into the via channel, a metal deposited through a mask and into the channel, or metal flowing into the channel during deposition of the bonding pad, 16 of FIG. 1 and 26 of FIG. 2. The only parameters for the interconnection metallurgy are that it provide electrical connection and that deposition of the metal does not alter the overlayer, the latter being an attribute of the overlayer material rather than of the metallurgy itself. Multiple layers of polymer and interconnect metallurgy may be fabricated in this manner to provide the desired package.

Interconnection to another related structure is illustrated in FIG. 6, further discussed below, wherein the co-sintered metal or metal-based via, 63, protrudes beyond the surface of the substrate after sintering. Therein, the overlayer will be conformally coated and any excess removed from the surface of the metal feature. As the illustration shows, if there is a gap about the via/metal feature, the overlayer material will seal the gap off in the absence of a capture pad. This form of sealing may be particularly advantageous as it allows the via material an impermeable air gap for expansion without the via material contacting the ceramic. Furthermore, the superior dielectric properties of air make it the perfect insulator adjacent the conductors for improved speed performance. In the instance of the raised metal feature, there is no alignment concern when interconnecting to the overlayer surface. If the structure was sintered with the metal feature abutting the ceramic, as opposed to with an air gap, cracking of the ceramic would be seen in all probability. The overlayer would, of course, eliminate any permeability created thereby by filling the cracks. To complete the structure, a metal or metal-based bonding pad will be deposited onto the surface of the overlayer. The devices, pins or wires bonded thereto will create stresses in the polymer, which can readily dissipate those stresses given its superior mechanical properties. The glass-ceramic body is, therefore, not exposed to any post-sintering stresses sufficient to cause cracking or fracture.

EXAMPLE 1

A sample of the first embodiment of the invention was fabricated in the following manner;

A slurry of binders, solvents, plasticizers and crystallizable glass having its principal crystalline phase of cordierite was cast into greensheets as taught in the referenced art. The dried greensheets were patterned and the pattern metallized with a copper-based metallurgy. The metallized greensheets were then stacked, at which time an additional Cu-based metallurgy was applied through masks to the top and bottom surfaces in contact with the metallization pattern on the top and bottom greensheets. Lamination and sintering were conducted in accordance with the known procedures as set out in Herron, et al U.S. Pat. No. 4,234,367. Subsequent to firing, the top and bottom substrate surfaces were spray-coated with a thin layer, 5 $\mu$m layer of a PMDA-ODA derived polyimide. The polyimide was thermally cured in accordance with the specifications. A mask having dimensions substantially smaller than the metallization mask was utilized for projection etching of the polyimide to form holes in the polyimide and expose the surface metallization below. Using the same mask as was utilized in the earlier surface metallization step, bonding pads were applied to the surface of the polyimide layer. The holes in the polyimide were filled by the screening of the first metal applied for the bonding pads, so that an additional deposition step was not required. On the bottom, or pin-joining surface, multilayer metal was applied for the bonding pads as is known in the art. Different metallurgy systems would be used for the top and bottom surfaces given the bonding requirements which each surface has. For the pin-joining surface, the appropriate metallurgical system used was a multilayer stack of 180 Å of Zr (having superior adhesion), 5 $\mu$m of Cu (for electromigration resistance), 1 $\mu$m of Ti (to promote adhesion between to Cu and the braze metal) and 5000 Å of Au for brazing. Pins were brazed to the bonding pads and several pin pull tests were conducted. The pins withstood the maximum pull strength of 10.7±0.3 lbs. with no ceramic fails/fractures. For the device-joining surface, bonding pads having the appropriate metallurgy for the desired bonds is deposited in accordance with well-known techniques. For example, for a wire bonding site, deposition of a multilayer stack including a thick gold bonding layer was conducted using known sputtering techniques. For flip-chip bonding sites, multilayer pads suitable for solder bonding were deposited in accordance with well-known practices. In each instance, the bonds remained intact through several thermal excursions, indicating that both thermal and mechanical stresses on the substrate had been relieved.

A second embodiment, as illustrated by FIGS. 3A–B and 4A–C and 7, teaches the use of a conformal overlayer, but does not involve subtractive etching of any portion of the layer for achieving electrical connection in the regions of the overlayer aligned to the underlying metallurgical features. This embodiment provides for continual coverage by the conformable overlayer with no possibility of exposure of the substrate surface after deposition of the overlayer. Specifically, one example of this "second" embodiment, seen in FIGS. 3A and B, is the use of an electrically insulative or semiconductive overlayer, herein polysilicon, 39, blanket deposited onto the surface of the substrate, 32, by chemical vapor deposition or other appropriate technique. Subsequent to the deposition of the insulative overlayer, conductivity is selectively induced into the overlayer in those regions, 35, in alignment with and abutting the underlying metal features, 33. Inducing conductivity in a polysilicon layer can be accomplished by ion implantation through the same mask which could be used for subsequent deposition of bonding pads. Although the aligned regions are conductive, they would in most instances be poor sites for direct attach of pins, devices, wires, etc. Therefore, subsequent deposition of bonding pads would be preferable. Another example of a material which can be deposited as a insulative layer and in which conductivity can be selectively induced is chalcogenide glass which can be rendered conductive by thermal fusion with the use of radiant heat. A preferred mode of the subject conformal layer approach is to deposit a polymeric layer, which has the desired stress-dissipating mechanical properties, and to selectively induce conductivity in those regions in alignment with the underlying metal features, by chemical doping for example. With the deposition of such a polymeric material, capture pads may not be necessary for sealing purposes as the polymer could fill at least the surfaces of any gap that may be present, see area 31 in FIG. 3B. The self-alignment feature of this embodiment obviates the need for a large diameter target for subtractive etching and interconnection. The reduction to practice of this embodiment of the invention has not been achieved; however, it is speculated that one skilled in the art could successfully attain such a structure.

Still another approach to the implementation of the second embodiment of the invention, as seen in FIGS. 4A–C, is the blanket deposition of a conducting overlayer, 49, and the subsequent passivation of those portions of the overlayer, 49', which are *not* in alignment with the underlying conductors, 43. The regions of the overlayer, 45, which are in alignment with the underlying features can be masked from the processing which passivates the remaining portions of the overlayer, for example an oxidation procedure. The material which remains conductive (e.g. non-oxidized) can serve as the bonding pad, or, if deemed necessary, another deposition can be made to provide a pad. In the alternative, as seen in FIG. 4C, the bonding pad, 48, can be deposited prior to the passivating step with the pad, itself, serving as the mask to protect the underlying material, 45, from the passivation. Necessarily, the metal chosen for the bonding pad should be impervious to the passivation technique employed to render the non-masked portions of the overlayer non-conducting. Many variations and implementations of the proposed conformal layer can be envisioned and it is intended that the claimed invention not be limited solely to the examples recited herein.

An additional means for implementing the second embodiment would be to choose a material for which the resistive value of the material would render it conductive in certain geometric arrangements with respect to the other conductive media in the package and non-conductive in other geometries (specifically, not capable of conduction between features which could cause shorts, but conductive from the overlying bonding pad to the underlying metal feature). This embodiment is illustrated in FIG. 7 wherein the conformal film, 79, is chosen having a resistivity such that the resistance, $R_v$, between the overlying feature, 76, and the via, 73, of $t/L^2$ is at a functional level so that conduction can take place between the respective metal features whereas the resistance $R_{ns}$, referred to as the non-shorting resistance between one metal feature, 78, and another, 76, of L/Lt, is sufficient to prohibit conduction between the respective features, where L is the distance between features on the same plane (i.e. the surface of the conformal film) and t is the thickness of the conformal film.

As noted above, the following inventive method for obtaining a co-sintered stud on the internal metallurgy extending above the surface of the substrate provides ease of interconnection to the top surface of a subsequently deposited overlying sealing/stress relief layer. The processing of the substrate is conducted in accordance with typical procedures up through the stacking of the metallized greensheets. An additional metallized greensheet is then added to the top and/or bottom surfaces of the package, and the known processing steps resumed. This additional greensheet is metallized with the same conductive metallurgy as is used throughout the substrate and the metallurgy will, therefore, co-sinter. However, the additional greensheet is chosen to be a material which will not co-sinter with the bulk ceramic but will be readily removable from the surface of the sintered body. In the context of a glass-ceramic which sinters in the range of 700°-1000° C., it is appropriate to use a metallized alumina greensheet as the top and/or bottom additional greensheet. The alumina, which has a sintering temperature well in excess of 1200° C., will not sinter at the relatively low temperatures used for the sintering of the glass-ceramic. Additionally, the alumina will remain sufficiently porous to allow for binder removal from the underlying glass-ceramic. Furthermore, with the removal of the binders from the alumina sheet, all that remains at the substrate surface after the sintering of the glass-ceramic is a powdery alumina which is readily removed from the surface of the substrate without the necessity of abrading the substrate surface and possibly shearing the sintered metallurgical studs. After removal of the alumina powder, a polyimide or other overlayer material can be conformally deposited on the glass-ceramic surface and over the studs and planarized back by any standard process to re-expose the studs' surfaces. The use of such a process as the co-sintered stud formation provides strong, self-aligned, co-sintered connections eliminating several potential sources for difficulties in the alignment and planarization processes. It is envisioned that the disclosed co-sintered stud technology could be utilized for many structures apart from the disclosed planar, metallized sealing layer. Ease of testing, for example, for any metallized part will be enhanced by the presence of protruding metal. The inventors do not wish the teachings to be interpreted as limited to the specific embodiments discussed herein.

The foregoing teachings represent the best known modes of achieving the inventive hermetic substrate. It should be understood to those having skill in the art that the invention is not limited to the specific examples and materials discussed. Changes in form and detail may be made without departing from the spirit and scope of the invention as hereinafter claimed.

What is claimed is:

1. A structure for electrically interconnecting a substrate having conductive vias therein and associated articles comprising:

at least one first conductive bonding pad disposed on the surface of said substrate in alignment with said conductive vias;

at least one layer of polymeric material disposed on the surface of said substrate covering said first bonding pads;

at least one second conductive bonding pad deposited on said at least one polymeric layer; and at least one conductive medium disposed in said polymeric material contacting said first and said second bonding pads.

2. The structure of claim 1, wherein said first bonding pad has a diameter substantially greater than the diameter of said via.

3. The structure of claim 1, wherein said substrate comprises at least a crystallizable glass.

4. The structure of claim 1, wherein said conductive vias comprise a copper-based metallurgy.

5. The structure of claim 1, wherein said first bonding pad is comprised of a material having good adhesion to the substrate.

6. The structure of claim 1 wherein first bonding pad is Cu-based.

7. The structure of claim 1, wherein said second bonding pad is comprised of a material exhibiting good adhesion to the polymeric material.

8. The structure of claim 1, wherein said first conductive bonding pad and said conductive medium are comprised of a co-sintered stud.

9. The structure of claim 1, wherein said polymeric layer comprises a multilayer structure comprising at least a first layer abutting said substrate and having good adhesion to said substrate, and a second layer on which said second pads are deposited said second layer having good adhesion to said second bonding pads.

10. The structure of claim 9, wherein said multilayer structure also comprises at least one intermediate layer of polymeric material disposed between said first and second layers and having superior cushioning properties.

11. The structure of claim 9, wherein said polymeric multilayer structure comprises a first layer of BTDA-APB derived polyimide, an intermediate layer of PMDA-ODA derived polyimide and a second layer of BTDA-APB derived polyimide.

12. The structure of claim 1, wherein said conductive medium comprises a selectively doped section of said polymeric material.

13. A bonding structure for a multilayer ceramic substrate having sintered internal metallurgy therein and extending to the top and bottom surfaces thereof comprising:

at least one layer of non-porous material disposed on each of the top and bottom surfaces of said substrate, said layer having conductive regions in contact with said internal metallurgy extending to said surfaces and non-conductive regions between said conductive regions; and bonding sites in contact with said conductive regions.

14. The structure of claim 13 wherein said bonding sites are the surfaces of said conductive regions.

15. The structure of claim 13 wherein said bonding sites are disposed on the surface of said non-porous layer in contact with said conductive regions.

16. The structure of claim 13 wherein said conductive regions comprise the same metallurgy as said internal metallurgy and are cosintered therewith.

17. The structure of claim 13 wherein said conductive regions comprise metal-based conductors disposed in said non-porous layer.

18. The structure of claim 13 wherein said non-porous layer comprises a polymeric material.

19. The structure of claim 18 wherein said conductive regions comprise metal-based conductors disposed in said polymeric material.

20. The structure of claim 18 wherein said conductive regions comprise the same metallurgy as said internal metallurgy and are consintered therewith.

21. The structure of claim 13 wherein said non-porous layer comprises a semiconductive material.

22. The structure of claim 13 wherein said non-porous layer comprises polysilicon.

23. The structure of claim 13 wherein said non-porous material comprises chalcogenide glass and wherein said conductive regions comprise fused chalcogenide glass.

24. The structure of claim 15 wherein said non-porous layer comprises a multilayer polymer structure comprising at least a first layer disposed on said substrate surface having good adhesion to said substrate surface and a second layer having good adhesion to said bonding sites.

25. The structure of claim 24 additionally comprising an intermediate polymeric layer having high elasticity.

26. The structure of claim 13 additionally comprising contact pads on the surface of said substrate in contact with said internal metallurgy surfaces.

27. The structure of claim 26 wherein the diameter of said contact pad is substantially greater than the diameter of said internal metallurgy surfaces.

28. The structure of claim 13 wherein said substrate comprises at least a glass ceramic comprising a crystalline phase.

29. The structure of claims 13, 16 and 17 wherein said metallurgy comprises a copper-based metallurgy.

30. A structure for mounting interconnections and semiconductor devices comprising:
an insulating substrate having internal metallurgy co-sintered therewith, at least one portion of said internal metallurgy extending to at least one of said top and bottom surfaces of said substrate;
a layer of non-porous material deposited on at least one of the top and bottom surfaces of said substrate, said layer comprising at least one area of non-conductivity and at least one area of conductivity, said at least one area of conductivity being in contact with said portion of said internal metallurgy which extends to said substrate surfaces; and
at least one metal-based bonding pad deposited onto said non-porous layer in contact with said at least one area of conductivity.

31. The structure of claim 30, wherein said non-porous material is a semiconductive material.

32. The structure of claim 30, wherein said non-porous material comprises a polysilicon material.

33. The structure of claim 30, wherein said non-porous material comprises a polymeric material having at least one selectively doped area of conductivity in contact with said at least one portion of said internal metallurgy extending to said substrate surfaces.

34. The structure of claim 30, wherein said non-porous material comprises a metal-oxide layer having at least one selected non-oxidized area of conductivity in contact with said at least one portion of said internal metallurgy extending to said substrate surfaces.

35. The structure of claim 30, wherein said non-porous material has a fixed resistivity and the thickness of said layer is less than or equal to the minimum distance required for conduction in said material, and wherein said distance between bonding pads is greater than the minimum distance required for low resistivity conduction in said material.

36. The structure of claim 30, wherein the non-porous material is chosen to have a resistivity which is insufficient to prevent conduction across the thickness of said layer, between said at least one internal metallurgy portion and said contacted bonding pad, but sufficient to prevent conduction between bonding pads.

37. A method of providing a sealing and mounting structure on a fired substrate, said substrate having sintered metal-based vias therein and extending to the surfaces thereof, comprising:
selectively depositing at least one first metal-based conductor to the surface of said substrate contacting said vias;
depositing at least one layer of polymeric material on the surface of said substrate and said first metal-based conductors;
selectively etching at least one opening in said polymeric material to expose at least a portion of said at least one first metal-based conductor; and
selectively providing at least one second metal-based conductor to the surface of said polymeric layer about said at least one opening, each of said second metal-based conductors being aligned with one of said openings.

38. The method of claim 37, further comprising the step of depositing at least one intermediate metal-based conductor to said at least one opening in said material.

39. The method of claim 38, wherein said deposition of said at least one intermediate metal-based conductor is conducted simultaneously with said selective provision of said at least one second metal-based conductor.

40. The method of claim 38, wherein said deposition of said at least one intermediate metal-based conductor is conducted prior to said selective provision of said at least one second metal-based conductor.

41. A method for providing a sintered insulative substrate from metallized greensheets, said substrate having metal-based internal conductors wherein said metal-based conductors protrude above the surface of said substrate comprising the steps of:
stacking said greensheets in alignment with each other;
providing at least one metallized sheet to at least one of said top and bottom surfaces of said stack, said metallized sheet comprising a sheet material which will not sinter to said stack at the coalescence temperature of said greensheets, and having a metal-based pattern of the same metallurgy as said metal-based internal metallurgy and said pattern features being in alignment with said metal-base internal metallurgy;
laminating said stack with said at least one metallized sheet;
firing said laminated structure to a temperature sufficient to effect coalescence of greensheets and to sinter said metal-based internal metallurgy and said metal-based pattern, but not sufficient to melt said metallurgy; and
removing said sheet material from the surface of said fired substrate, while not removing said sintered metal-based pattern from said surface.

42. A method for fabricating an hermetic sintered substrate having metal-based vias from metallized greensheets comprising the steps of:

stacking said greensheets in alignment with each other;

providing at least one metallized sheet to at least one of said top and bottom surfaces of said stack, said metallized sheet being comprised of a sheet material which will not sinter to said stack at the coalescence temperatures of said greensheets, and having a metal-based pattern of the same metallurgy as said metal-based vias and said pattern features being in alignment with said metal-based vias;

laminating said stack with said at least one metallized sheet;

firing said laminated structure to a temperature sufficient to cause said greensheets to coalesce and to sinter said metal-based vias and said metal-based pattern, but not sufficient to melt said metallurgy;

removing said sheet material from the surface of said fired stack, said sintered metal-based pattern remaining as a pattern of studs above said surface;

depositing a layer of conformable insulative material to the surface of said fired stack; and planarizing said conformable material to the level of the surface of said studs.

43. The method of claim 41 and 42, wherein said substrate comprises an insulating material at least comprised of a crystallizable glass and wherein said metal-based vias and metal-based pattern are copper based.

44. The method of claim 43, wherein said sheet material is alumina.

45. The method of claim 44, wherein said laminated structure is fired to a temperature sufficient to effect crystallization of said crystallizable glass, but not sufficient to sinter said alumina.

46. The method of claim 42, further comprising the step of depositing metal-based bonding pads to the surface of said conformable layer, each of said bonding pads being in contact with the surface of one of said studs.

47. A method for providing a sealing and mounting structure on a fired hermetic substrate, said substrate having internal conductors, the surfaces of some of which extend to the top and bottom substrate surfaces, comprising the steps of:

depositing a layer of non-porous material on at least one of said top and bottom surfaces of said substrate; and providing areas of conductivity in said non-porous material in contact with said conductor surfaces and areas of non-conductivity between said areas of conductivity.

48. The method of claim 47, wherein said material is semiconductive and said providing of said areas of conductivity comprises selectively doping said material.

49. The method of claim 48, wherein said material is polysilicon.

50. The method of claim 47, wherein said material is chalcogenide glass and said providing of said conductive areas comprises selectively fusing said glass.

51. The method of claim 47, wherein said material is a polymer and said providing of said areas of conductivity comprises selectively doping said polymeric material.

52. The method of claim 47, wherein said providing of said areas of conductivity is preceded by the step of;

selectively depositing a mask on said substrate surfaces in alignment with said surfaces of said internal conductors.

53. The method of claim 47, additionally comprising the step of;

depositing conductive bonding pads to the surface of said non-porous layer in alignment with said surfaces of said internal conductors.

54. The method of claim 52, wherein said selectively depositing of said mask additionally serves to deposit conductive bonding pads to the surfaces of said substrate.

55. The method of claim 47, wherein said non-porous material is conductive and wherein said providing of areas of conductivity and non-conductivity comprises;

depositing a mask on said material in contact with said areas of conductivity which are in contact with said surfaces of said internal conductors;

rendering said exposed areas of said material non-conductive.

56. The method of claim 55, wherein said material is metallic and wherein said rendering step comprises oxidizing said metal.

57. The method of claim 47, wherein said providing of said areas of conductivity comprises the steps of;

selectively etching openings in said deposited material in alignment with said surfaces of said internal conductors; and filling said openings with conductive material.

58. The method of claim 57, wherein said selective etching comprises laser etching.

59. The method of claim 53, wherein said filling of said openings is achieved by;

depositing conductive bonding pads to the surface of said material in alignment with said surfaces of said internal conductors.

60. The method of claim 47, additionally comprising the step of depositing contact pads to the surfaces of said internal conductors prior to depositing said non-porous material.

* * * * *